United States Patent
Narui et al.

(10) Patent No.: US 6,924,024 B2
(45) Date of Patent: *Aug. 2, 2005

(54) COPPER-CLAD LAMINATE

(75) Inventors: Kohji Narui, Yamaguchi (JP); Nobuyuki Yamamoto, Yamaguchi (JP); Toshihiko Anno, Yamaguchi (JP)

(73) Assignee: Ube Industries Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/622,471

(22) Filed: Jul. 21, 2003

(65) Prior Publication Data

US 2004/0110015 A1 Jun. 10, 2004

(30) Foreign Application Priority Data

Jul. 19, 2002 (JP) ........................................ 2002-211258

(51) Int. Cl.$^7$ .......................... B32B 15/08; B29C 47/06; H05K 3/38

(52) U.S. Cl. .................. 428/141; 156/308.2; 156/309.6; 428/450; 428/451; 428/458; 428/473.5

(58) Field of Search ........................... 156/308.2, 309.6; 428/141, 450, 451, 458, 473.5

(56) References Cited

U.S. PATENT DOCUMENTS 6,699,572 B2 * 3/2004 Yamamoto et al. ......... 428/216

* cited by examiner

Primary Examiner—D. S. Nakarani
(74) Attorney, Agent, or Firm—Nixon Peabody LLP; Jeffrey L. Costellia

(57) ABSTRACT

A copper-clad laminate is composed of a copper foil and an aromatic polyimide film placed thereon, in which the copper foil is bonded to the polyimide film at a bonding strength of ≧500 N/m and the polyimide film shows a light transmittance of ≧40% for a light of wavelength of 600 nm and a haze of ≧30% [the light transmittance and haze are values measured after the copper foil is removed by etching].

13 Claims, 1 Drawing Sheet

COPPER-CLAD LAMINATE

FIELD OF THE INVENTION

The present invention relates to a copper-clad laminate and a process for preparing the laminate.

BACKGROUND OF THE INVENTION

Aromatic polyimide films show good high temperature resistance, good chemical properties, high electrical insulating property, and high mechanical strength, and therefore are widely employed in a variety of technical fields. For instance, an aromatic polyimide film is favorably employed in the form of a continuous aromatic polyimide film/copper foil laminate structure for manufacturing a flexible printed circuit board (FPC), a carrier tape for tape-automated-bonding (TAB), and a tape of lead-on-chip (LOC) structure.

The aromatic polyimide film/copper foil laminate can be produced by bonding a polyimide film to a copper foil using a conventional adhesive such as an epoxy resin. However, due to low heat-resistance of the conventional adhesive, the produced composite sheet cannot show satisfactory high heat-resistance.

For obviating the above-mentioned problem, a variety of bonding methods have been proposed. For instance, an aromatic polyimide film/copper foil laminate sheet is manufactured by producing a copper foil on an aromatic polyimide film by electro-plating. Otherwise, an aromatic polyamide solution (i.e., a solution of a precursor of an aromatic polyimide resin) is coated on a copper foil, dried, and heated for producing an aromatic polyimide film on the copper foil.

An aromatic polyimide film/copper foil composite sheet also can be produced using a thermoplastic polyimide resin.

U.S. Pat. No. 4,543,295 describes that a metal film/aromatic polyimide film laminate in which the metal film is bonded to the polyimide film at a high bonding strength is prepared by combining, namely by heating under pressure, a metal film and a composite aromatic polyimide film composed of a highly heat resistant substrate film and a thermoplastic thin polyimide layer bonded to the substrate film at a high bonding strength.

SUMMARY OF THE INVENTION

It is an object of the present invention to provide a copper-clad laminate that has a high bonding strength between the copper foil and the polyimide film and shows a high transparency, the high transparency being measured after the copper foil is removed by etching.

The invention resides in a copper-clad laminate comprising a copper foil having a surface roughness in terms of Rz of 1 μm or less and an aromatic polyimide film placed thereon, wherein the copper foil is bonded to the polyimide film at a bonding strength of 500 N/m or higher (T peel strength) and the polyimide film shows a light transmittance of 40% or higher for a light of wavelength of 600 nm and a haze of 30% or higher, the light transmittance and haze being values measured after the copper foil is removed by etching.

The copper-clad laminate of the invention can be preferably manufactured by a process comprising the steps of:

preparing a copper foil having a surface roughness in terms of Rz of 1 μm or less and an adhesive surface and an aromatic polyimide film comprising a polyimide substrate film having no glass transition temperature at temperatures of lower than 340° C. and at least one thermoplastic polyimide film placed on the polyimide substrate film, the thermoplastic polyimide film having a glass transition temperature in the range of 200 to 275° C.;

placing the thermoplastic polyimide film of the aromatic polyimide film on the adhesive surface of the copper foil; and heating the thermoplastic polyimide film and the copper foil at a temperature of higher than the glass transition temperature of the thermoplastic polyimide film but not higher than 400° C. under pressure.

The invention further resides in a copper-clad laminate comprising a copper layer and an aromatic polyimide film placed thereon, wherein the copper layer is bonded to the polyimide film at a bonding strength of 500 N/m or higher under the condition that the bonding strength after heating at 150° C. for 1,000 hours is 285 N/m or higher, and the polyimide film shows a light transmittance of 40% or higher for a light of wavelength of 600 nm and a haze of 30% or higher, the light transmittance and haze being values measured after the copper layer is removed by etching.

DETAILED DESCRIPTION OF THE INVENTION

Figure 1:
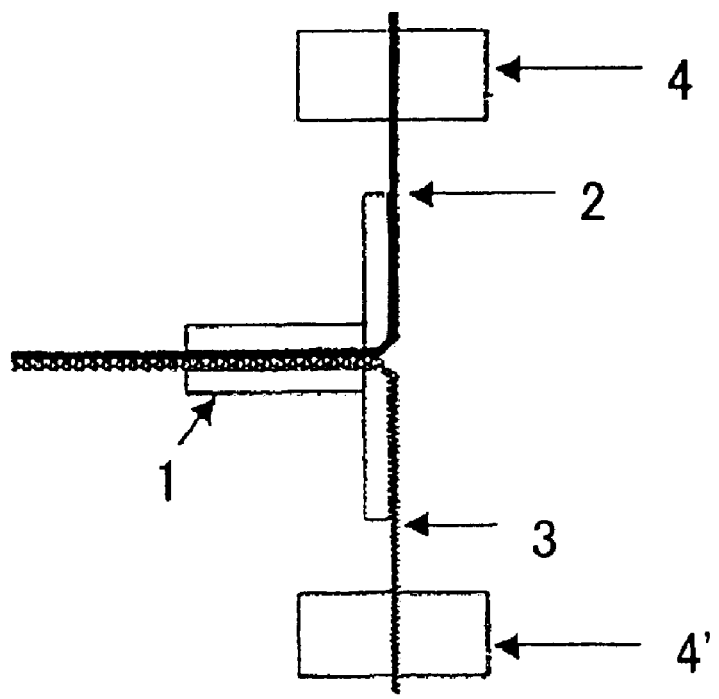
FIG. 1 illustrates a view indicating a procedure of measuring a bonding strength in terms of T peel strength.

Preferred embodiments of the invention are described below:

(1) The polyimide film has a thermoplastic surface at least on one side.

(2) The polyimide film comprises a polyimide substrate film having no glass transition temperature at temperatures of lower than 340° C. and at least one thermoplastic polyimide film placed on the polyimide substrate film, the thermoplastic polyimide film having a glass transition temperature in the range of 180 to 275° C.

(3) The copper-clad laminate shows a bonding strength of 285 N/m or higher, the bonding strength being measured between the copper foil and the polyimide film after the laminate is kept at 150° C. for 1,000 hours.

(4) The copper-clad laminate shows a bonding strength of 80% or higher of an initial bonding strength between the copper foil and the polyimide film, the former bonding strength being measured after the laminate is kept at 150° C. for 1,000 hours.

(5) The copper foil has an adhesive surface.

(6) The adhesive surface of the copper foil is produced by placing a coupling agent (e.g., a silane coupling agent) on the copper-foil.

(7) The copper foil is in the form of a continuous film having a gloss of 360% or higher in a longitudinal direction thereof and a gloss of 310% or higher in a width direction thereof. The glosses are measured at an angle of incidence of 60°.

The copper-clad laminate of the invention employs a copper foil having a low roughness such as a surface roughness (Rz) of 1 μm or less. Such a low roughness surface can be prepared by producing a blackened layer (i.e., copper oxide layer) on a copper foil by oxidation treatment or plating copper or chromium on a copper foil. Accordingly, the copper foil or layer may contain a small amount of a foreign metal.

The copper foil preferably has an adhesive surface which can be produced by treating the copper foil surface with an organic surface treating agent such as a coupling agents (e.g., silane-coupling agent).

The copper foil having an adhesive surface on its surface preferably has a thickness of 5 to 18 μm, particularly a thickness of 9 to 12 μm, because such a thin copper foil favorably serves to give a fine circuit pattern.

The copper foils having an adhesive surface are commercially available. Examples of the commercially available adhesive copper foils include a low-roughness copper foil available from Mitsui Metal Industries, Co., Ltd. (thickness: 12 μm, surface roughness (Rz) on matted surface: 0.8 μm, gloss on the rough surface: 319% for TD (traverse direction or width direction), 374% for MD (machine direction or longitudinal direction)), a low-roughness copper foil available from Furukawa Circuit Foil, Co., Ltd. (thickness: 12 μm, surface roughness (Rz) on matted surface: 0.7 μm, gloss on the rough surface: 370% for TD, 393% for MD), and a low-roughness copper foil available from Nippon Electrolysis, Co., Ltd. (thickness: 12 μm, surface roughness (Rz) on matted surface: 0.8 μm, gloss on the rough surface: 370% for TD, 393% for MD).

The aromatic polyimide film preferably has a thermoplastic surface at least on one side. More preferably, the polyimide film comprises a polyimide substrate film having no glass transition temperature at temperatures of lower than 340° C. and at least one thermoplastic polyimide film placed on the polyimide substrate film, the thermoplastic polyimide film having a glass transition temperature in the range of 200 to 275° C. The former polyimide substrate film may be hereinafter referred to as a high heat resistance polyimide film. The substrate film can have the thermoplastic polyimide film on both surface sides.

The thermoplastic polyimide film is preferably formed on the substrate film by the steps of co-extruding a precursor solution of the high heat resistance polyimide and a precursor solution of the thermoplastic polyimide, drying the co-extruded precursor solution film, and heating the dried films to give a multilayered polyimide film.

The thermoplastic polyimide film is preferably prepared from 1,3-bis(4-amimophenoxybenzene) (hereinafter referred to a TPER), 2,3,3',4'-biphenyltetracarboxylic dianhydride (hereinafter referred to as a-BPDA) and 3,3',4,4'-biphenyltetracarboxylic dianhydride (hereinafter referred to as s-BPDA). The following combinations are also preferred to give the thermoplastic polyimide film:

1,3-bis(4-aminophenoxy)-2,2-dimethylpropane (DANPG) and 4,4'-oxydiphthalic anhydride (ODPA);

4,4'-oxydiphthalic anhydride (ODPA), pyromellitic dianhydride (PMDA), and 1,3-bis(4-aminophenoxybenzene);

1,3-bis(3-aminophenoxy)benzene and 3,3',4,4'-benzophenonetetracarboxylic dianhydride; and 3,3'-diaminobenzophenone, 1,3-bis(3-aminophenoxy)-benzene and 3,3',4,4'-benzophenonetetracarboxylic dianhydride.

A portion of the tetracarboxylic dianhydride compound can be replaced with one or more of other tetracarboxylic dianhydrides such as 3,3',4,4'-biphenyltetracarboxylic dianhydride or 2,2-bis(3,4-dicarboxyphenyl)-propane dianhydride, provided that the replacement does not give essentially harmful effects to the resulting polyimide film.

A portion of the diamine compound can be replaced with one or more other diamine compounds such as aromatic diamines having plural benzene rings, for example, 4,4'-diaminodiphenyl ether, 4,4'-diaminobenzophenone, 4,4'-diaminophenylmethane, 2,2-bis(4-aminophenyl)propane, 1,4-bis(4-aminophenoxy)benzene, 4,4'-bis(4-aminophenyl),-diphenyl ether, 4,4'-bis(4-aminophenoxy) diphenyl ether, 4,4'-bis(4-aminophenoxy)diphenylmethane, and 2,2-bis[4-(aminophenoxy)phenyl]propane.

Further, a dicarboxylic acid such as phthalic acid or its derivative or hexahydrophthalic acid or its derivative, particularly phthalic dianhydride, can be incorporated into the starting compound mixtures for the preparation of the thermoplastic polyimide film.

The high heat resistance polyimide film can be prepared from 3,3',4,4'-biphenyltetracarboxylic dianhydride (s-BPDA) and p-phenylenediamine (PPD), and optionally 4,4'-diaminodiphenyl ether (DADE) and pyromellitic dianhydride (PMDA). PPD/DADE (molar ratio) preferably is in the range of 100/0 to 85/15. s-BPDA/PMDA (molar ratio) preferably is 100/0 to 50/50.

The high heat resistance polyimide film can be also prepared from pyromellitic dianhydride, p-phenylenediamine, (PPD) and 4,4'-diaminodiphenyl ether (DADE). DADE/PPD (molar ratio) preferably is in the range of 90/10 to 10/90.

The high heat resistance polyimide film can be also prepared from 3,3',4,4'-benzophenonetetracarboxylic dianhydride anhydride (BTDA), pyromellitic dianhydride (PMDA),p-phenylenediamine (PPD) and 4,4'-diaminodiphenyl ether (DADE). The tetracarboxylic dianhydride preferably comprises 20 to 90 molar % of BTDA and 80 to 10 molar % of PMDA. The diamine compound preferably comprises 30 to 90 molar % of PPD and 70 to 10 molar % of DADE.

The aromatic rings of the tetracarboxylic anhydrides and diamine compounds can have one or more substituents groups such as fluorine, hydroxyl, methyl, and methoxy.

A portion of the tetracarboxylic dianhydride compound and a portion of the diamine compound can be replaced with one or more of other tetracarboxylic dianhydrides and aromatic diamines (e.g., 4,4'-diaminodiphenylmethane), provided that the replacements do not give essentially harmful effects to the resulting polyimide film.

The high heat resistance polyimide substrate film preferably has a linear expansion coefficient (MD, TD and their average, at 50–200° C.) of $5 \times 10^{-6}$ to $25 \times 10^{-6}$ cm/cm/° C.

The high heat resistance polyimide film can be prepared from the aforementioned monomers by any of random polymerization, block polymerization, blending of polymers, and polymerization of blended precursors (polyamic acids).

The polyamide acids for the high heat resistance polyimide and thermoplastic polyimide can be prepared in an organic solvent such as N-methyl-2-pyrrolidone, N,N-dimethylformamide, N,N-dimethylacetamide, N,N-diethylacetamide, dimethylsulfoxide, hexamethylphosphorylamide, N-methylcaprolactam, or cresol. These organic solvents can be used singly or in combination.

In order to prohibit gelation of the polyamic acid, 0.01% to 1% (per the solid content of the polyamic acid) of a phosphorus stabilizers such as triphenyl phosphite and triphenyl phosphate can be added to the polyamic acid solution. In order to accelerate the imidation reaction, particularly, in the case of carrying out the reaction at a low temperature, a basic organic catalyst such as imidazole, 2-imidazole, 1,2-dimethylimidazole or 2-phenylimidazole can be added to the polyamic acid solution. The organic catalyst is generally employed in an amount of 0.01 to 20 wt. %, preferably 0.5 to 10 wt. %, based on the solid content of the polyamic acid.

In the preparation of an aromatic polyimide film comprising a substrate polyimide film and one or two thermoplastic polyimide films by co-extrusion, a polyamic acid solution for the substrate film and one or two polyamic acid solutions for the thermoplastic polyimide film(s) are simultaneously extruded in the form of solution films from a multi-slit dye onto a temporary support such as a stainless steel belt and heated to 100–200° C. for drying the extruded solution films, to give a semi-cured self-supporting film composite. The extrusion procedures are already known.

The semi-cured self-supporting film composite is then heated to a temperature of higher than the glass transition temperature of the thermoplastic polyimide film, preferably 300 to 500° C. (surface temperature measured by means of a surface thermometer), preferably for 1 to 60 minutes, to dry and imidize the semi-cured film composite. Thus, the desired aromatic polyimide film comprising a substrate polyimide film and one or two thermoplastic polyimide films is obtained.

The thermoplastic polyimide film preferably has a glass transition temperature in the range of 180 to 275° C., more preferably 200 to 275° C., and preferably does not turn into liquid at temperatures of lower than 300° C. Further, the thermoplastic polyimide film preferably shows an modulus of elasticity at 275° C. as much as 0.0002 to 0.2 time the modulus of elasticity at 50° C.

The thermoplastic polyimide film preferably has a thickness of 0.5 to 10 $\mu$m, more preferably 1 to 8 $\mu$m.

The high heat resistance polyimide substrate film preferably has a thickness of 5 to 50 $\mu$m, more preferably 5 to 40 $\mu$m.

The composite polyimide film comprising the high heat resistance polyimide substrate film and a thermoplastic polyimide cover film preferably has a thickness of 7 to 50 $\mu$m, more preferably 7 to approx. 40 $\mu$m.

The composite polyimide film preferably has a linear expansion coefficient (MD, TD and their average, at 50–200° C.) of $10 \times 10^{-6}$ to $25 \times 10^{-6}$ cm/cm/° C.

As described hereinbefore, the copper-clad laminate of the invention can be manufactured by a process comprising the steps of placing the thermoplastic polyimide film of the composite polyimide film on a copper foil (or copper layer) and heating the thermoplastic polyimide film and the copper foil (or copper layer) at a temperature of higher than the glass transition temperature of the thermoplastic polyimide film but not higher than 400° C. under pressure. The above-mentioned steps are preferably carried out by means of a known double belt press. In the steps, the copper foil and the composite polyimide film are simultaneously pre-heated to approx. 150–250° C. just before they are inserted into the double belt press, and then heated to an elevated temperature and cooled to give the desired copper-clad laminate. In the double belt press, it is preferred that the heating zone is heated to a temperature of not more than 400° C. but higher than the glass transition temperature of the thermoplastic polyimide film by more than 20° C., and thus heated laminate is cooled in the cooling zone under pressure at a temperature of lower than the glass transition temperature of the thermoplastic polyimide film by more than 20° C., preferably more than 30° C.

In the process of the manufacturing the desired copper-clad laminate, the copper foil and the three layered composite polyimide film can be carried on a film having a smooth surface, such as a high heat resistance film, preferably an aromatic polyimide film (e.g., Upilex S, available from Ube Industries, Ltd.), a fluororesin film, or a rolled copper foil.

The laminate comprising the copper foil and the aromatic polyimide film having an adhesive surface is generally obtained in the form of a continuous film. The continuous film can be used after dividing into a film having a predetermined size.

The copper-clad laminate of the invention can be stored in the form of a roll. The rolled laminate can be unwound and etched in known ways. The etched laminate can be subjected to curl-removing treatment.

The copper-clad laminate of the invention can be employed as a substrate for FPC, TAB, multilayered FPC, and flex rigid substrate.

A plurality of the copper-clad laminates of the invention can be combined with each other via a heat resistant adhesive layer (thickness: 5 to 50 $\mu$m, preferably 5 to 15 $\mu$m, more preferably 7 to 12 $\mu$m) to give a multilayered copper-clad laminates such as 2 to 20 layered copper-clad laminates. The heat resistant adhesive can be an epoxy adhesive, a thermoplastic adhesive, or a mixture of a thermoplastic polyimide (or polyimidesiloxane) and an epoxy compound.

The etching of the copper-clad laminate can be carried out by a known method, for instance, an etching procedure using an aqueous ferric chloride solution to remove a portion or whole of the copper foil from the polyimide film at a room temperature.

The copper-clad laminate of the invention can be immersed in a solder bath of approx. 280° C. for approx. 10 minutes or bonded to other copper-clad laminate via a heat resistant adhesive, for the preparation of the desired devices.

The copper-clad laminate of the invention shows a high transparency after a portion or whole of the copper foil is etched out, and hence can be easily handled by the conventional bonding machines for TAB mounting.

The present invention is further described by the following examples. In the examples, the physical characteristics were determined by the below-mentioned procedures.

(1) Surface roughness (Rz): measured according to JIS B0601
(2) Gloss: measured according to JIS Z8741, average value
(3) Thermal linear expansion: TMA method, an average of values measured at 50 to 200° C., temperature elevation rate: 5° C./min., an average of values measured for TD and MD, cm/cm/° C.
(4) Glass transition temperature (Tg): measured by means of a dynamic viscoelastometer, by determining a loss tangent peak temperature.
(5) Bonding strength: A specimen (width: 10 mm) cut from a copper-clad laminate is mounted on an apparatus illustrated in FIG. 1 (1: T-peel measuring-apparatus, 2: copper foil, 3: polyimide film, 4: clamp, 4': clamp), and the T-peel strength (MD) is measured according to JIS C6471 at a cross-head speed of 50 mm/min.
(6) Light transmittance: measured on a film (or a copper-clad laminate after removal of a whole copper foil by etching) by applying a light (wavelength: 600 nm) at 90° angle to measure the transmitted light in UV-2100 type apparatus available from Shimazu Seisakusho Co., Ltd.

(7) Haze: measured on a film (or a copper-clad laminate after removal of a whole copper foil by etching) according to JIS K6714 using a direct current computer HGM-2DP (available from Suga Testing Machine, Co., Ltd.)

Haze (%)=(Td/Tt)×100

(Td: scattered light transmittance

Tt: total light transmittance)

(8) Observation of alignment mark: visually evaluated on a copper-clad laminate after removal of a whole copper foil by etching by means of Inner Lead Bonder 1LT-110 (available from Sinkawa Co., Ltd.) using a demonstration pattern.

(9) Bonding strength after heating at 150° C.: A specimen is placed in a thermostat (heated at 150° C.) having an air ventilation system for 1,000 hours and then measured a T-peel strength at a crosshead speed of 50 mm/min., according to the method defined in JIS C6471.

(10) Total evaluation: AA: excellent, BB: good, CC: not satisfactory, DD: bad

[Preparation of a dope solution I for producing a high heat resistance polyimide]

In a reaction vessel equipped with a stirrer and a nitrogen gas inlet were placed N-methyl-2-pyrrolidone, and a combination of p-phenylene diamine and 3,3',4,4'-biphenyltetracarboxylic dianhydride (molar ratio: 1000:998) in an amount to give an N-methyl-2-pyrrolidone solution containing 18 wt. % of the combination. The resulting mixture was then kept at 50° C. for 3 hrs. under stirring, to give a brown-colored viscous polyamic acid solution having a solution viscosity of approx. 1,500 poise at 25° C. This polyamic acid solution was used as the dope solution I.

[Preparation of a dope solution II for producing a thermoplastic polyimide]

In a reaction vessel equipped with a stirrer and a nitrogen gas inlet were placed N-methyl-2-pyrrolidone, and a combination of 1,3-bis(4-aminophenoxy)benzene, 2,3,3',4-biphenyltetracarboxylic dianhydride, and 3,3',4,4'-biphenyltetracarboxylic dianhydride (molar ratio: 100:20:80) in an amount to give an N-methyl-2-pyrrolidone solution containing 18 wt. % of the combination. Further, 0.1% (per the amount of the combination) of triphenylphosphate was added to the solution. The resulting mixture was then kept at 25° C. for one hour. under stirring, to give a viscous polyamic acid solution having a solution viscosity of approx. 1,100 poise at 25° C. This polyamic acid solution was used as the dope solution II.

[Preparation of polyimide composite film]

The dope solution I and the dope solution II was placed in a multi-manifold type molding die for three film extrusion. A combination of the dope solution II, the dope solution I, and the dope solution II was simultaneously extruded from the die and casted on a stainless steel belt support. The casted solution films were dried by continuously applying an air heated to 140° C., to give a solid film. The solid film was separated from the support and placed in a heating furnace to gradually heating the solid film from 200° C. to 320° C. Thus, the solvent was removed and the film was imidized to give a polyimide film. These procedures were repeated under the condition that the slit sizes were varied, to give the below-mentioned two polyimide composite films A and B.

[Polyimide composite film A]

Thickness: 5 μm/28 μm/5 μm (total: 38 μm) in terms of thermoplastic film/high heat resistance film/thermoplastic film Tg of thermoplastic film: 240° C.

Tg of high heat resistance film: higher than 340° C.

Light transmittance (wavelength: 600 nm): 57%

Haze: 6%

Linear heat expansion coefficient (50–200° C.): $18 \times 10^{-6}$ cm/cm/° C.

Volume resistance: $3 \times 10^{16} \Omega \cdot cm$

[Polyimide composite film B]

Thickness: 4 μm/17 μm/4 μm (total: 25 μm) in terms of thermoplastic film/high heat resistance film/thermoplastic film Tg of thermoplastic film: 240° C.

Tg of high heat resistance film: higher than 340° C.

Light transmittance (wavelength: 600 nm): 69%

Haze: 4%

Linear heat expansion coefficient (50–200° C.): $18 \times 10^{-6}$ cm/cm/° C.

Volume resistance: $3 \times 10^{16} \Omega \cdot cm$

EXAMPLE 1

The polyimide composite film A, a low roughness adhesive copper foil (available from Mitsui Metal Industries, Co., Ltd., thickness: 12 μm, Rz on the rough surface: 0.8 μm, gloss on the rough surface: 319% for TD, 374% for MD), and a protective film (Upilex 25S) were simultaneously supplied into a double belt press continuously. These materials were continuously pre-heated, heated up to 330° C. (predetermined highest temperature), and cooled to 117° C. (lowest temperature) for 2 minutes under a pressure of 40 kg/cm², to give a continuous copper-clad laminate (width: approx. 530 mm) of the invention. The physical characteristics of the continuous copper-clad laminate are set forth below.

Bonding strength: 1,290 N/m

Light transmittance (wavelength: 600 nm): 44%

Haze: 27%

Observation of alignment mark: observable

Retention of bonding strength after heat treatment at 150° C. for 1,000 hours: 94%

Total evluation: AA

EXAMPLE 2

The procedures of Example 1 were repeated except that a low roughness adhesive copper foil (available from Nippon Electrolysis, Co., Ltd., thickness: 12 μm, Rz on the rough surface: 0.8 μm, gloss on the rough surface: 370% for TD, 393% for MD) was employed, to give a continuous copper-clad laminate (width: approx. 530 mm) of the invention. The physical characteristics of the continuous copper-clad laminate are set forth below.

Bonding strength: 710 N/m

Light transmittance (wavelength: 600 nm): 43%

Haze: 28%

Observation of alignment mark: observable

Retention of bonding strength after heat treatment at 150° C. for 1,000 hours: 82%

Total evluation: AA

EXAMPLE 3

The procedures of Example 1 were repeated except that a low roughness adhesive copper foil (available from Furukawa Circuit Foil, Co., Ltd., thickness: 12 μm, Rz on the rough surface: 0.7 µm, gloss on the rough surface: 370% for TD, 393% for MD) was employed, to give a continuous copper-clad laminate (width: approx. 530 mm) of the invention. The physical characteristics of the continuous copper-clad laminate are set forth below.

Bonding strength: 540 N/m

Light transmittance (wavelength: 600 nm): 48%

Haze: 20%

Observation of alignment mark: observable

Retention of bonding strength after heat treatment at 150° C. for 1,000 hours: 64%

Total evluation: BB

EXAMPLE 4

The procedures of Example 1 were repeated except that the polyimide composite film B and a low roughness adhesive copper foil (NA-VLP, available from Mitsui Metal Industries, Co., Ltd., thickness: 12 µm, Rz on the rough surface: 0.6 µm, gloss on the rough surface: 339% for TD, 410% for MD) were employed, to give a continuous copper-clad laminate (width: approx. 530 mm) of the invention. The physical characteristics of the continuous copper-clad laminate are set forth below.

Bonding strength: 610 N/m

Light transmittance (wavelength: 600 nm): 54%

Haze: 22%

Observation of alignment mark: observable

Retention of bonding strength after heat treatment at 150° C. for 1,X,000 hours: 106%

Total evluation: AA

EXAMPLE 5

The procedures of Example 1 were repeated except that a low roughness adhesive copper foil (HLS, available from Nippon Electrolysis, Co., Ltd., thickness: 9 µm, Rz on the rough surface: 0.8 µm, gloss on the rough surface: 339% for TD, 410% for MD) was employed, to give a continuous copper-clad laminate (width: approx. 530 mm) of the invention. The physical characteristics of the continuous copper-clad laminate are set forth below.

Bonding strength: 816 N/m

Light transmittance (wavelength: 600 nm): 43%

Haze: 28%

Observation of alignment mark: observable

Retention of bonding strength after heat treatment at 150° C. for 1,000 hours: 77%

Total evluation: AA

EXAMPLE 6

The procedures of Example 1 were repeated except that a low roughness adhesive copper foil (F0-WS, available from Furukawa Circuit Foil, Co., Ltd., thickness: 12 µm, Rz on the rough surface: 0.7 µm, gloss on the rough surface: 392% for TD, 403% for MD) was employed, to give a continuous copper-clad laminate (width: approx. 530 mm) of the invention. The physical characteristics of the continuous copper-clad laminate are set forth below.

Bonding strength: 560 N/m

Light transmittance (wavelength: 600 nm): 61%

Haze: 14%

Observation of alignment mark: observable

Retention of bonding strength after heat treatment at 150° C. for 1,000 hours: 67%

Total evluation: BB

COMPARISON EXAMPLE 1

The procedures of Example 1 were repeated except that a high roughness adhesive copper foil (available from Mitsui Metal Industries, Co., Ltd., thickness: 9 µm, Rz on the rough surface: 2.0 µm) was employed, to give a continuous copper-clad laminate (width: approx. 530 mm) of comparison. The physical characteristics of the continuous copper-clad laminate are set forth below.

Bonding strength: 780 N/m

Light transmittance (wavelength: 600 nm): 10%

Haze: 76%

Observation of alignment mark: not observable

Total evluation: DD

COMPARISON EXAMPLE 2

The procedures of Example 1 were repeated except that a high roughness adhesive copper foil (available from Furukawa Circuit Foil, Co., Ltd., thickness: 9 µm, Rz on the rough surface: 1.9 µm) was employed, to give a continuous copper-clad laminate (width: approx. 530 mm) of comparison. The physical characteristics of the continuous copper-clad laminate are set forth below.

Bonding strength: 740 N/m

Light transmittance (wavelength: 600 nm): 10%

Haze: 76%

Observation of alignment mark: not observable

Total evaluation: DD

COMPARISON EXAMPLE 3

The procedures of Example 1 were repeated except that a high roughness adhesive copper foil (SC12-25-00AE, available from Japan Steel Chemistry, Co., Ltd.) was employed, to give a continuous copper-clad laminate (width: approx. 530 mm) of comparison. The physical characteristics of the continuous copper-clad laminate are set forth below.

Light transmittance (wavelength: 600 nm): 2%

Observation of alignment mark: not observable

Total evaluation: DD

What is claimed is:

1. A copper-clad laminate comprising a copper foil having a surface roughness in terms of Rz of 1 µm or less and an aromatic polyimide film placed thereon, wherein the copper foil is bonded to the polyimide film at a bonding strength of 500 N/m or higher and the polyimide film shows a light transmittance of 40% or higher for a light of wavelength of 600 nm and a haze of 30% or higher, the light transmittance and haze being values measured after the copper foil is removed by etching.

2. The copper-clad laminate of claim 1, wherein the polyimide film has a thermoplastic surface at least on one side.

3. The copper-clad laminate of claim 2, wherein the polyimide film comprises a polyimide substrate film having no glass transition temperature at temperatures of lower than 340° C. and at least one thermoplastic polyimide film placed on the polyimide substrate film, the thermoplastic polyimide film having a glass transition temperature in the range of 180 to 275° C.

4. The copper-clad laminate of claim 1, which shows a bonding strength of 285 N/m or higher, the bonding strength being measured between the copper foil and the polyimide film after the laminate is kept at 150° C. for 1,000 hours.

5. The copper-clad laminate of claim 1, which shows a bonding strength of 80% or higher of an initial bonding strength between the copper foil and the polyimide film, the former bonding strength being measured after the laminate is kept at 150° C. for 1,000 hours.

6. The copper-clad laminate of claim 1, wherein the copper foil has an adhesive surface.

7. The copper-clad laminate of claim 6, wherein the adhesive surface is produced by placing a coupling agent on the copper foil.

8. The copper-clad laminate of claim 6, wherein the coupling agent is a silane-coupling agent.

9. The copper-clad laminate of claim 1, wherein the copper foil is in the form of a continuous film having a gloss of 360% or higher in a longitudinal direction thereof and a gloss of 310% or higher in a width direction thereof, the glosses being measured at an incident angle of 60°.

10. A process for manufacturing a copper-clad laminate of claim 1, which comprises the steps of:

preparing a copper foil having a surface roughness in terms of Rz of 1 μm or less and an adhesive surface and an aromatic polyimide film comprising a polyimide substrate film having no glass transition temperature at temperatures of lower than 340° C. and at least one thermoplastic polyimide film placed on the polyimide substrate film, the thermoplastic polyimide film having a glass transition temperature in the range of 200 to 275° C.;

placing the thermoplastic polyimide film of the aromatic polyimide film on the adhesive surface of the copper foil; and heating the thermoplastic polyimide film and the copper foil at a temperature of higher than the glass transition temperature of the thermoplastic polyimide film but not higher than 400° C. under pressure.

11. The process of claim 10, wherein the step of heating the thermoplastic polyimide film and the copper foil is performed by means of a double belt press.

12. The process of claim 10, wherein the adhesive surface of the copper foil is produced by placing a coupling agent on the copper foil.

13. A copper-clad laminate comprising a copper layer and an aromatic polyimide film placed thereon, wherein the copper layer is bonded to the polyimide film at a bonding strength of 500 N/m or higher under the condition that the bonding strength after heating at 150° C. for 1,000 hours is 285 N/m or higher, and the polyimide film shows a light transmittance of 40% or higher for a light of wavelength of 600 nm and a haze of 30% or higher, the light transmittance and haze being values measured after the copper layer is removed by etching.

* * * * *